United States Patent
Xue et al.

(10) Patent No.: US 10,621,085 B2
(45) Date of Patent: Apr. 14, 2020

(54) STORAGE SYSTEM AND SYSTEM GARBAGE COLLECTION METHOD

(71) Applicant: HUAWEI TECHNOLOGIES CO., LTD., Shenzhen, Guangdong (CN)

(72) Inventors: Qiang Xue, Chengdu (CN); Peijun Jiang, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/059,938

(22) Filed: Aug. 9, 2018

(65) Prior Publication Data

US 2018/0349272 A1 Dec. 6, 2018

Related U.S. Application Data (63) Continuation of application No. PCT/CN2016/105512, filed on Nov. 11, 2016.

(51) Int. Cl.
*G06F 12/02* (2006.01)
*G06F 12/00* (2006.01)
(Continued)

(52) U.S. Cl.
CPC .......... *G06F 12/0253* (2013.01); *G06F 3/065* (2013.01); *G06F 3/0608* (2013.01);
(Continued)

(58) Field of Classification Search
CPC .. G06F 3/0608; G06F 3/0631; G06F 12/0253; G06F 2212/7201; G06F 2212/7202; G06F 2212/7205
See application file for complete search history.

(56) References Cited

U.S. PATENT DOCUMENTS

2012/0297128 A1    11/2012   Eleftheriou et al.
2014/0279900 A1    9/2014   Gupta et al.
(Continued)

FOREIGN PATENT DOCUMENTS

AU     2015381014 A1   6/2017
CN     102479060 A     5/2012
(Continued)

OTHER PUBLICATIONS

JVM Memory Management and GC Mechanism, from http://1028826685.iteye.com/blog/2315280, 38 pages.

*Primary Examiner* — Baboucarr Faal
*Assistant Examiner* — Jane Wei (57) ABSTRACT

A storage system and a system garbage collection method are provided. The storage system includes a first controller, a second controller, and a solid state disk. The first controller or the second controller manages storage space of the solid state disk in a unit of a segment. The first controller is configured to perform system garbage collection on multiple segments of segments managed by the first controller. The second controller is configured to: when the first controller performs system garbage collection, perform system garbage collection on multiple segments of segments managed by the second controller. The multiple segments of the segments managed by the first controller and the multiple segments of the segments managed by the second controller are allocated within a same time period. Therefore, a quantity of times of write amplification in the solid state disk can be reduced.

8 Claims, 2 Drawing Sheets

A controller 11 collects statistics about a data volume of invalid data included in each segment group — 401

The controller 11 compares data volumes of invalid data included in all the segment groups, to determine a segment group including a maximum volume of invalid data — 402

The controller 11 performs a system garbage collection on a segment included in the determined segment group — 403

A controller 22 performs a system garbage collection on a segment included in the segment group — 404

(51) Int. Cl.
   *G11C 16/06*   (2006.01)
   *G06F 3/06*    (2006.01)
(52) U.S. Cl.
   CPC .......... *G06F 3/0631* (2013.01); *G06F 3/0679* (2013.01); *G06F 12/00* (2013.01); *G06F 12/02* (2013.01); *G06F 12/0246* (2013.01); *G11C 16/06* (2013.01); *G06F 2212/7201* (2013.01); *G06F 2212/7202* (2013.01); *G06F 2212/7205* (2013.01)

(56) References Cited

U.S. PATENT DOCUMENTS

| | | |
|---|---|---|
| 2015/0074327 A1 | 3/2015 | Xu et al. |
| 2015/0378886 A1 | 12/2015 | Nemazie et al. |
| 2016/0124847 A1* | 5/2016 | Malwankar ......... G06F 12/0253 |
| | | 711/103 |
| 2016/0132429 A1 | 5/2016 | Lin |
| 2016/0162189 A1 | 6/2016 | Malwankar et al. |
| 2016/0179422 A1* | 6/2016 | Lee .................... G06F 11/10 |
| | | 711/103 |
| 2016/0259594 A1* | 9/2016 | Takahashi ............ G06F 3/0619 |
| 2018/0024779 A1* | 1/2018 | Kojima ............... G06F 12/0246 |
| | | 711/103 |
| 2018/0024921 A1 | 1/2018 | Kanno |

FOREIGN PATENT DOCUMENTS

| | | |
|---|---|---|
| CN | 102622308 A | 8/2012 |
| CN | 103412826 A | 11/2013 |
| CN | 103577338 A | 2/2014 |
| CN | 103902465 A | 7/2014 |
| JP | 2013513881 A | 4/2013 |
| JP | 2016212835 A | 12/2016 |
| WO | 2011073902 A1 | 6/2011 |
| WO | 2017092015 A1 | 6/2017 |

* cited by examiner

STORAGE SYSTEM AND SYSTEM GARBAGE COLLECTION METHOD

CROSS-REFERENCE TO RELATED APPLICATIONS

This application is a continuation in of International Application No. PCT/CN2016/105512, filed on Nov. 11, 2016, the disclosure of which is hereby incorporated by reference in its entirety.

TECHNICAL FIELD

This application relates to the field of storage technologies, and in particular, to a storage system and a system garbage collection method.

BACKGROUND

A flash array is a storage system that includes a solid state disk and at least two controllers. The controller manages storage space of the solid state disk in a unit of segment. A segment is an area of contiguous logical addresses that is allocated by the controller. The segment is also a basic unit of system garbage collection. Each controller may write received data into a segment managed by the controller. Data received by the solid state disk from each controller is sequentially written into a block in the solid state disk in a time sequence of receiving the data. Therefore, data sent by all the controllers may be written into a same block within a time period. Therefore, data stored in each block may be corresponding to segments managed by different controllers.

After a flash array performs system garbage collection and releases some segments, a block in a solid state disk is not fully erased because the block still includes data in another segment on which system garbage collection is not performed. Therefore, when performing garbage collection in the solid state disk, the solid state disk still needs to write, into a blank block, the data in the block of the another segment on which system garbage collection is not performed. Consequently, a large quantity of times of write amplification occur in the solid state disk.

SUMMARY

This application provides a storage system and a system garbage collection method, so as to reduce a quantity of times of write amplification in a solid state disk.

A first aspect of this application provides a storage system. The storage system includes a first controller, a second controller, and a solid state disk. The solid state disk is connected to the first controller, and the solid state disk is connected to the second controller. The first controller or the second controller manages storage space of the solid state disk in a unit of a segment. The first controller is configured to perform system garbage collection on multiple segments of segments managed by the first controller. When the first controller performs system garbage collection, the second controller performs system garbage collection on multiple segments of segments managed by the second controller. The multiple segments of the segments managed by the first controller are allocated by the first controller within a time period, and the multiple segments of the segments managed by the second controller are also allocated by the second controller within the time period.

In the storage system provided in this application, a first controller performs system garbage collection on multiple segments of segments managed by the first controller, and a second controller also performs system garbage collection on multiple segments of segments managed by the second controller. The segments on which the first controller performs system garbage collection and the segments on which the second controller performs system garbage collection are allocated within a same time period. Because a segment is a unit in which the first controller or the second controller manages storage space of a solid state disk, writing data into the segment is writing the data into the storage space of the solid state disk. The segments on which the first controller and the second controller perform system garbage collection are allocated within the same time period. Therefore, data in the segments is written into the solid state disk at close times. Further, when writing the data, the solid state disk sequentially writes the data into one or more blocks in a time sequence of receiving the data. Therefore, after system garbage collection is performed on the segments allocated within the same time period, all valid data in a block corresponding to the segments has been copied into another block, and all data in the block corresponding to the segments becomes invalid data. When the solid state disk performs internal garbage collection, valid data does not need to be copied again for the block corresponding to the segments on which system garbage collection is performed. Therefore, a quantity of times of write amplification in the solid state disk is reduced.

With reference to the first aspect, in a first implementation of the first aspect, the multiple segments of the segments managed by the first controller are all segments allocated by the first controller within the time period. In addition, the multiple segments of the segments managed by the second controller are all segments allocated by the second controller within the time period. Therefore, it can be ensured that system garbage collection is performed on all the segments allocated within the time period. In this case, all valid data in more blocks in the solid state disk is copied into another block, and is thereby referred to as invalid data.

With reference to the first aspect or the second implementation of the first aspect, in a third implementation of the first aspect, the time period ends when a quantity of segments allocated by the first controller or the second controller within the time period reaches a first preset threshold. In the implementation, the first controller and the second controller conveniently collect statistics about quantities of respective allocated segments. Therefore, operations are easy.

With reference to the first aspect or the second implementation of the first aspect, in a fourth implementation of the first aspect, the time period ends when a sum of quantities of segments allocated by the first controller and the second controller within the time period reaches a second preset threshold. Compared with the third implementation of the first aspect, in the fourth implementation of the first aspect, the first controller or the second controller needs to send a message to each other to query for a quantity of segments allocated by each other. Therefore, operations are relatively complex. However, in the implementation, upper limits of quantities of segments allocated within all time periods are the same. Statistics about a size of invalid data included in each segment group is subsequently collected, so that selection of a segment group including a maximum volume of invalid data is more accurate.

With reference to any one of the first aspect or the foregoing implementations of the first aspect, in a fifth implementation of the first aspect, the multiple segments of the segments managed by the first controller and the multiple segments of the segments managed by the second controller belong to a same segment group. A size of invalid data included in the segment group is larger than a size of invalid data included in any other segment group. In the fifth implementation of the first aspect, the first controller may send a message to the second controller to query for a size of invalid data included in the segments managed by the second controller. The first controller calculates a sum of a size of invalid data included in the segments managed by the first controller and the size of the invalid data included in the segments managed by the second controller, so as to obtain a segment group including a maximum volume of invalid data. This ensures that a segment group on which system garbage collection is to be performed is a segment group including a maximum volume of invalid data. Efficiency of system garbage collection is improved.

With reference to any one of the first aspect or the first implementation to the fourth implementation of the first aspect, in a sixth implementation of the first aspect, the multiple segments of the segments managed by the first controller and the multiple segments of the segments managed by the second controller belong to a same segment group. A size of invalid data included in the multiple segments of the segments managed by the first controller is larger than a size of invalid data included in multiple segments that belong to any other segment group and that are in the segments managed by the first controller. Compared with the fifth implementation of the first aspect, the first controller needs to collect statistics only about a size of invalid data included in the segments managed by the first controller, and does not need to send a message to the second controller to query for a size of invalid data included in the segments managed by the second controller.

With reference to the fifth implementation of the first aspect or the sixth implementation of the first aspect, in a seventh implementation of the first aspect, the first controller sends a group identifier of the segment group to the second controller. The second controller determines, according to a pre-stored correspondence between the group identifier and an identifier of each of the multiple segments of the segments managed by the second controller, the multiple segments of the segments managed by the second controller. In the seventh implementation, the first controller determines a group identifier of a segment group on which system garbage collection is to be performed, and sends the group identifier to the second controller. The second controller may search, according to the group identifier, for multiple segments that belong to the segment group.

With reference to the seventh implementation of the first aspect, in an eighth implementation of the first aspect, an identifier of each segment managed by the first controller is allocated by the first controller, and an identifier of each segment managed by the second controller is allocated by the second controller.

With reference to the seventh implementation of the first aspect, in a ninth implementation of the first aspect, an identifier of each segment managed by the first controller is allocated by the first controller. An identifier of each segment managed by the second controller is also allocated by the first controller. For example, the second controller sends a segment identifier application request to the first controller to obtain an identifier.

With reference to any one of the first aspect or the foregoing implementations of the first aspect, in a tenth implementation of the first aspect, specific operations of performing system garbage collection by the first controller are as follows: The first controller sends, to the solid state disk, a source logical address of valid data included in each of the multiple segments of the segments managed by the first controller. The first controller allocates a destination logical address to the valid data and sends the destination logical address to the solid state disk, to instruct the solid state disk to copy the valid data from the source logical address into the destination logical address. Then, the first controller sends an unmap command to the solid state disk. The unmap command includes a logical address range of each of the multiple segments of the segments managed by the first controller, to instruct the solid state disk to delete a correspondence, which is stored by the solid state disk, between a logical address and an actual address of each segment.

A second aspect of this application provides a system garbage collection method. The method is applied to the storage system provided in the first aspect, and is performed by the first controller and the second controller in the first aspect.

A third aspect of this application provides a computer program product, including a computer-readable storage medium that stores program code, and an instruction included in the program code may be executed by the first controller and the second controller in the first aspect, and may be used to perform at least one method in the second aspect.

BRIEF DESCRIPTION OF DRAWINGS

To describe technical solutions in embodiments of the present invention more clearly, the following briefly describes the accompanying drawings required for the embodiments.

DESCRIPTION OF EMBODIMENTS

Embodiments of the present invention provide a storage system and a garbage collection method, so as to reduce a quantity of times of write amplification in a solid state disk.

Figure 1:
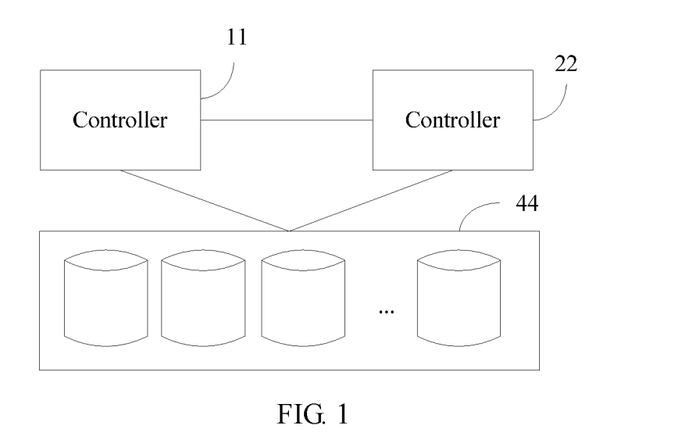
FIG. 1 is a diagram of an application scenario according to an embodiment of the present invention.

FIG. 1 is a composition diagram of a storage system according to an embodiment of the present invention. The storage system shown in FIG. 1 includes at least two controllers (a controller 11 and a controller 22 shown in the figure) and multiple solid state disks 44.

The controller 11 and the controller 22 each are connected to a host (not shown in the figure) by using a storage area network (SAN). The controller 11 may communicate with the controller 22. The controller 11 has a same physical structure and function as the controller 22. The controller 11 is used as an example. The controller 11 may be a computing device, such as a server or a desktop computer. An operating system and an application program are installed on the controller 11. The controller 11 may receive an input/output (I/O) request from the host. The controller 11 may further store data (if there is data) carried in the I/O request, and write the data into the solid state disk 44.

The solid state disk (SSD) is a memory using a flash memory chip as a storage medium, and is also referred to as a solid state drive (SSD).

Descriptions are provided in FIG. 1 only for an illustration purpose. In practical application, a storage system may include multiple controllers. A physical structure and a function of each controller are similar to those of the controller 11. In addition, a manner of connection between the controller 11 and the controller 22 and a manner of connection between any controller and the solid state disk 44 are not limited in this embodiment, provided that the controllers can communicate with each other and that each of the controllers and the solid state disk 44 can communicate with each other.

Figure 2:
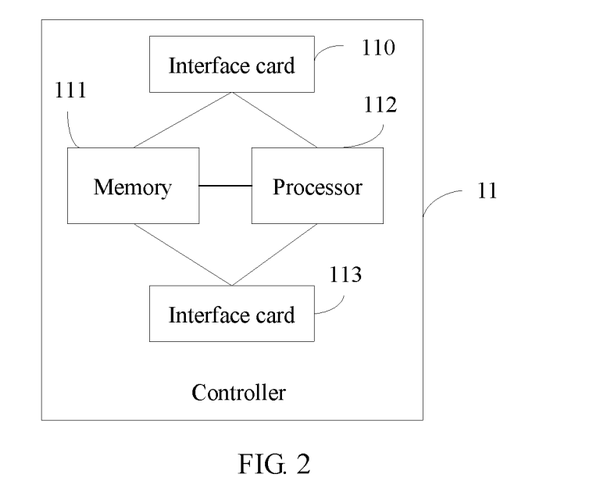
FIG. 2 is a structural diagram of a controller according to an embodiment of the present invention.

FIG. 2 is an example diagram of a structure of the controller 11. As shown in FIG. 2, the controller 11 includes an interface card 110, a processor 112, and an interface card 113.

The interface card 110 is configured to communicate with the host. The controller 11 may receive an operation instruction of the host by using the interface card 110. The processor 112 may be a central processing unit (CPU). In this embodiment of the present invention, the processor 112 may be configured to: receive an I/O request from the host and process the I/O request. The I/O request may be a data write request or a data read request. The processor 112 may further send data in the data write request to the solid state disk 44. In addition, the processor 112 may be further configured to perform a system garbage collection operation.

Optionally, the controller 11 may further include a memory 111. The memory 111 is configured to temporarily store data received from the host or data read from the solid state disk 44. When the controller 11 receives multiple data write requests sent by the host, data in the multiple data write requests may be temporarily stored in the memory 111. When a size of data stored in the memory 111 reaches a specific threshold, the data stored in the memory 111 and a logical address allocated to the data are sent to the solid state disk 44. The solid state disk 44 stores the data. The memory 111 includes a volatile memory, a nonvolatile memory, or a combination thereof. The volatile memory is, for example, a random access memory (RAM). The nonvolatile memory is, for example, various machine readable media that can store program code, such as a floppy disk, a hard disk, a solid state disk (SSD), or an optical disc. The memory 111 has a power failure protection function. The power failure protection function means that the data stored in the memory 111 is not lost even when the system is powered off and then powered on again.

The interface card 113 is configured to communicate with the solid state disk 44. The controller 11 may send, by using the interface card 113, a data write request (including data and a logical address that is allocated by the controller 11 to the data) to the solid state disk 44 for storage.

A structure of the controller 22 and a function of each part of the controller 22 are similar to those of the controller 11. Details are not described herein again. In addition, both the controller 11 and the controller 22 are system controllers. The system controller is an independent device, and is different from a control chip in the solid state disk. In this embodiment, the control chip in the solid state disk is referred to as a solid state disk controller. The controller in this embodiment is a system controller unless otherwise specified.

The solid state disk 44 includes a solid state disk controller and a storage medium. The solid state disk controller is configured to perform an operation, such as a data write request or a data read request, sent by the controller 11 or the controller 22.

The solid state disk controller includes a flash translation layer (FTL). The flash translation layer is configured to store a correspondence between a logical address and an actual address of data. Therefore, the flash translation layer is configured to translate, into an actual address of data in the solid state disk, a logical address in a data write request or a data read request sent by the controller. The logical address of the data is a subset, which is allocated by the controller, of a logical address range of a segment. The logical address of the data includes a start logical address and a length. The start logical address indicates a location, in the segment, at which the data is located, and the length indicates a size of the data. The actual address of the data may be a physical address of the data in the solid state disk, or may be an address that is obtained by performing virtualization on the physical address and that is visible only to the solid state disk controller. The actual address obtained by means of virtualization is invisible to the system controller.

The storage medium generally includes one or more flash memory chips. Each flash memory chip includes several blocks. The flash memory chip performs reading or writing based on one page (English: page), but an erase operation can be performed only based on one block. The erase operation is as follows: All bits of the block are set to "1". Before erasing is performed, the solid state disk controller needs to first copy valid data in the block into a blank page of another block. The valid data in the block is data that is not modified and that is stored in the block, and the data may be read. Invalid data in the block is modified data stored in the block, and the data cannot be read.

Each block includes multiple pages (English: page). When performing a data write request, the solid state disk writes data in a unit of a page. For example, the controller 11 sends a data write request to the solid state disk controller. The data write request includes a logical address of data. After receiving the data write request, the solid state disk controller sequentially writes the data into one or more blocks in a time sequence of receiving the data. Sequentially writing the data into the one or more blocks means that, the solid state disk searches for a blank block and writes the data into the blank block until the blank block is full, and when a size of the data exceeds a capacity of the block, the solid state disk controller searches for a next blank block and continues to perform writing. The flash translation layer establishes and stores a correspondence between the logical address and an actual address of a page into which the data is written. When the controller 11 sends a data read request to the solid state disk controller to request to read the data, the data read request includes the logical address. The solid state disk controller reads the data according to the logical address and the correspondence between the logical address and the actual address, and sends the data to the controller 11.

The block, the page, and the actual address in the solid state disk are invisible to the controller. Therefore, the controller cannot directly access the block and the page in the solid state disk. To perform system garbage collection, the system controller divides storage space of the solid state disk into several segments according to a specified size. A segment is a basic unit of system garbage collection. Each segment is a set of multiple logical addresses, and the logical addresses are contiguous. For example, the specified size is 1024 KB. A logical address range corresponding to a segment is from 0 KB to 1023 KB, a logical address range corresponding to another segment is from 1024 KB to 2047 KB, a logical address range corresponding to still another segment is from 2048 KB to 3071 KB, and so on.

When data is being written into a segment, the data may be written in a unit of a sector. For example, a sector includes 520 bytes. The 512 bytes of the 520 bytes are data, and the other 8 bytes are a data integrity field (English: data integrity field, DIF) of the 512-byte data. That is, data written each time needs to be an integer multiple of 512 bytes. If a size of the data is not an integer multiple of 512 bytes, the data may be padded with zero. Likewise, when data is being read from a segment, the data is also read in a unit of a sector. In addition, after the data is written into the segment, validity of the data needs to be recorded. The validity of the data is determined according to whether the data is modified. If the data is written for the first time, the data may be recorded as being valid (referred to as valid data). If the data is modified, data before the modification is recorded as being invalid (referred to as invalid data). Specifically, the validity of the data may be recorded by using a bitmap. For example, each "bit" of the bitmap is corresponding to a logical address of data in a size of 1 KB. When the "bit" is 1, it indicates that the data stored at the logical address is valid. When the "bit" is 0, it indicates that the data stored at the logical address is invalid.

System garbage collection means that the controller performs garbage collection in a unit of a segment. The controller obtains a logical address of valid data in a segment according to the bitmap, and sends the logical address of the valid data to the solid state disk. In addition, the controller allocates a new logical address to the valid data, and sends the new logical address to the solid state disk. The solid state disk reads the valid data from the old logical address, and writes the valid data into the new logical address. Then, the controller sends an unmap (English: unmap) command to the solid state disk. The unmap command includes a logical address range of the segment on which system garbage collection is to be performed. After receiving the unmap command, the solid state disk deletes a correspondence, which is stored in the flash translation layer, between a logical address in the logical address range and an actual address. The solid state disk may further identify, as a block including no valid data, a block corresponding to the actual address.

System garbage collection is different from garbage collection in the solid state disk. The solid state disk completes garbage collection in the solid state disk without cooperation with the controller. The solid state disk controller first copies valid data in each block into a blank block, and then erases the original block. In addition, generally, a trigger condition of system garbage collection is that a quantity of free segments in the storage system is insufficient (for example, less than a threshold), and a trigger condition of garbage collection in the solid state disk is that a quantity of blank blocks in the solid state disk is insufficient.

A segment generally has four states that are respectively a free state, a writing state, a full state, and a bad state. A free-state segment is a segment without content. A writing-state segment is a segment into which data has been written but that is not full. A full-state segment is a segment of which all space is full. The writing-state segment and the full-state segment may become free-state segments after being erased. A bad-state segment is a bad segment that cannot be used.

Figure 3:
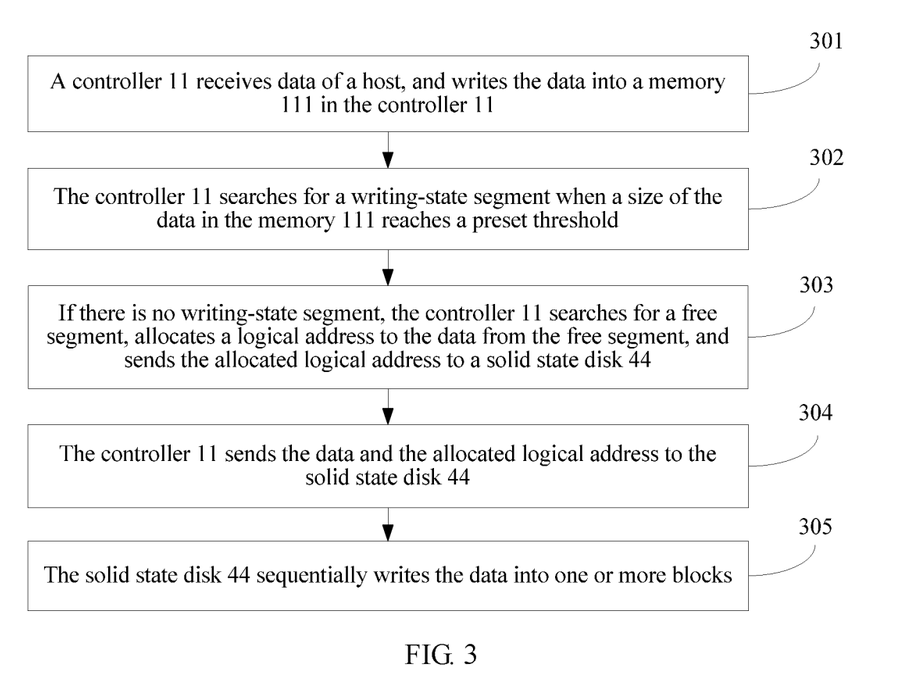
FIG. 3 is a flowchart of a data write method according to an embodiment of the present invention.

With reference to FIG. 3, the following describes a data write method provided in an embodiment. The method may be applied to an application scenario shown in FIG. 1, and performed by the controller 11 or the controller 22 shown in FIG. 1. For example, the method includes the following steps.

S301. The controller 11 receives data of a host, and writes the data into a memory 111 in the controller 11.

Specifically, a processor 112 may receive the data of the host by using an interface card 110, and write the data into the memory 111. Generally, the data is added to a data write instruction and sent to the controller 11.

S302. The controller 11 searches for a writing-state segment when a size of the data in the memory 111 reaches a preset threshold. Because a capacity of the memory 111 is limited, the data in the memory 111 needs to be written into a solid state disk 44 when the data stored in the memory 111 reaches the preset threshold.

Specifically, the controller 11 searches to determine whether there is a writing-state segment. For example, for a segment whose logical address range is from 0 KB to 1023 KB, data is written into a logical address of 0 KB to 100 KB, but data is still not written into a logical address of 101 KB to 1023 KB. In this case, the controller 11 may allocate a logical address to the data starting from 101 KB. If the size of the data is 2 KB, a start logical address allocated by the controller 11 to the data is 101 KB, and a length of the logical address is 2 KB.

If there is currently no segment into which data has been written but that is not full, step S303 is performed.

S303. The controller 11 searches for a free segment, allocates a logical address to the data from the free segment, and sends the allocated logical address to a solid state disk 44. For example, a segment whose logical address range is from 1024 KB to 2047 KB is a free segment. The controller 11 may allocate a logical address to the data starting from 1024 KB. If the size of the data is 2 KB, the logical address allocated by the controller 11 to the data is 1024 KB to 1026 KB.

S304. The controller 11 sends the data and the allocated logical address to the solid state disk 44.

S305. The solid state disk 44 sequentially writes the data into one or more blocks. An address at which the data is stored in the block is an actual address. After writing the data into the block, the solid state disk 44 stores, in a flash translation layer, a correspondence between the allocated logical address and the actual address.

After a segment is allocated by a controller, a homing relationship between the segment and the controller is determined. For example, the controller 11 selects a free segment whose logical address range is from 1024 KB to 2047 KB, and writes data into the segment. In this case, the segment can receive only the data written by the controller 11, and cannot receive data written by the controller 22. In addition, when a free segment is allocated by the controller 11, the controller 11 may allocate an identifier to the free segment. The identifier is used to uniquely identify the allocated segment. However, when writing data into a block, a solid state disk controller does not identify a specific controller from which the data comes, but only sequentially writes the data into the block in a time sequence of receiving the data. For example, the controller 11 sends, to the solid state disk 44, data whose size is 2 KB and whose logical address is 1024 KB to 1026 KB. The solid state disk controller writes the data into a blank block. Assuming that a capacity of the block is 1 MB, the block still has storage space of 1022 KB to store data. In this case, if the controller 22 also sends a data write request to the solid state disk 44, where the data write request includes data in a size of 3 KB, a logical address of the data is 2048 KB to 2051 KB, a segment corresponding to the data is a segment whose logical address range is from 2048 KB to 3071 KB, and the segment belongs to the controller 22 (is allocated by the controller 22), the solid state disk controller also writes the data into the block. In this case, the block still has storage space of 1019 KB to store data. If another controller still sends a data write request to the solid state disk 44, the solid state disk controller continues to write data of the another controller (that is, data in another segment) into the block. Alternatively, the solid state disk controller may write, into the block, data that is of another segment and sent by the controller 11 (if a last segment is full). Therefore, data stored in one block may belong to different segments.

An identifier of a segment may be a numeral, a letter, or another symbol used to uniquely identify the segment, or may be any combination of more than one of a numeral, a letter, or another symbol. If the controller does not allocate an identifier of a segment, the controller may identify each segment by using a logical address range of the segment. In addition, the identifier may be a sequence number. After allocating an identifier, the controller 11 stores a correspondence between the identifier and a logical address range of a segment. A process of allocating the identifier to the segment is described in detail subsequently.

The following describes a process in which a controller allocates an identifier to a segment.

The controller allocates the identifier to the segment (referred to as a segment identifier) according to a time period. In some application scenarios, each controller (for example, the controller 11 and the controller 22) in a storage system has an identifier allocation function. In some other application scenarios, only one controller in a storage system has an identifier allocation function. In this case, a controller without the identifier allocation function may send a segment identifier application request to the controller with the function to obtain an identifier.

EXAMPLE 1

Both the controller 11 and the controller 22 have the identifier allocation function. When the controller 11 allocates a free segment, the controller 11 allocates an identifier to the segment. Likewise, when the controller 22 allocates another free segment, the controller 22 allocates an identifier to the another free segment. Segments to which identifiers are allocated within a same time period belong to a same segment group. An end time point of the same time period is a moment at which a total quantity of identifiers allocated by any controller reaches a preset threshold. For example, the preset threshold is 100. When a total quantity of identifiers allocated by the controller 11 reaches 100, the controller 11 may send a notification message to the controller 22 to notify, to the controller 22, that a current time period ends. Therefore, within the time period (a start point of the time period is a moment at which the controller 11 or the controller 22 allocates the first identifier, and an end point is a moment at which the controller 11 allocates the $100^{th}$ identifier), a segment to which the controller 11 allocates an identifier and a segment to which the controller 22 allocates an identifier belong to a same group (referred to as a segment group). The controller 11 or the controller 22 allocates a group identifier to the group, and notifies each other of the group identifier. The controller 11 stores a correspondence between the group identifier and an identifier of each segment that is in the group and that is managed by the controller 11. The controller 22 stores a correspondence between the group identifier and an identifier of each segment that is in the group and that is managed by the controller 22.

EXAMPLE 2

Only the controller 11 has the identifier allocation function. In this case, when the controller 22 allocates a free segment, the controller 22 sends a request message to the controller 11 to request the controller 11 to allocate an identifier to the segment. In this case, an end time point of a same time period is a moment at which a total quantity of identifiers allocated by the controller with the identifier allocation function reaches a preset threshold. For example, the preset threshold is 100. Within a time period from allocating the first identifier by the controller 11 to allocating the $100^{th}$ identifier by the controller 11, segments to which the controller 11 allocates identifiers belong to a same group. The segments in the group include a segment managed by the controller 11, and also include a segment managed by the controller 22, but the identifiers of the segments are all allocated by the controller 11. Then, the controller 11 allocates a group identifier to the group, and notifies the controller 22 of the group identifier. The controller 11 stores a correspondence between the group identifier and an identifier of each segment that is in the group and that is managed by the controller 11. The controller 22 stores a correspondence between the group identifier and an identifier of each segment that is in the group and that is managed by the controller 22.

In both the example 1 and the example 2, the group identifier is allocated, and each controller records a correspondence between the group identifier and an identifier of a segment. If an identifier of a segment is not allocated and each segment is identified by using a logical address range of the segment, the controller also allocates a group identifier, and records a correspondence between the group identifier and the logical address range of the segment. If a segment is identified according to a specific rule by using a sequence number, a group identifier is unnecessary. In this case, segments that belong to a same group may be determined by using a sequence number rule.

For example, in an example 3, both the controller 11 and the controller 22 have a sequence number allocation function, and the controller 11 and the controller 22 may agree on a start sequence number of each group in advance. For example, a start sequence number of a first group is 1, a start sequence number of a second group is 101, a start sequence number of a third group is 201, and so on. A start sequence number allocated by the controller 11 is the same as a start sequence number allocated by the controller 22. Each controller successively allocates sequence numbers to segments starting from a start sequence number. Each sequence number is equal to a value obtained by increasing a value of a last sequence number by 1. For each group, when a total quantity of sequence numbers allocated by either controller reaches a preset threshold, both of the controllers perform allocation starting from a start sequence number of a next group. Content, in the example 3, other than a case in which an identifier of a segment is a sequence number is similar to that in the example 1. Details are not described herein again.

EXAMPLE 4

Only the controller 11 has the identifier allocation function, and the identifier is a sequence number. An example in which the controller 11 has a sequence number allocation function is used. The controller 11 presets a start sequence number of each group, and successively allocates sequence numbers to a segment of the controller 11 and a segment of the controller 22 starting from the start sequence number. Each sequence number is equal to a value obtained by increasing a value of a last sequence number by 1. When a total quantity of sequence numbers allocated by the controller 11 reaches a preset threshold, allocation is performed starting from a start sequence number of a next group. Specifically, when a sequence number needs to be allocated to the segment of the controller 22, the controller 22 sends a request message to the controller 11, and the controller 11 allocates the sequence number according to the request message, and sends the sequence number to the controller 22. A difference between the example 4 and the example 3 lies in that, in the example 3, because both the controller 11 and the controller 22 may allocate sequence numbers to segments, the sequence numbers are not always sequential and may be even the same, but in the example 4, because all sequence numbers are allocated by the controller 11, the sequence numbers are sequential and are not the same. Content, in the example 4, other than a case in which an identifier of a segment is a sequence number is similar to that in the example 2. Details are not described herein again.

It can be learned from the foregoing description that data stored in one block in a solid state disk belongs to different segments. It is assumed that data stored in a block respectively belongs to a segment with a sequence number 1, a segment with a sequence number 2, and a segment with a sequence number 3. If a controller performs garbage collection on the segment with the sequence number 1 and the segment with the sequence number 2, the solid state disk copies, into another segment, valid data corresponding to the two segments. However, data in the segment with the sequence number 3 is still reserved in the block. Therefore, when performing garbage collection in the solid state disk, the solid state disk still needs to read valid data from the block and copy the valid data into another block. Consequently, write amplification occurs in the solid state disk.

To reduce a quantity of times of write amplification in the solid state disk, in this embodiment of the present invention, when a system garbage collection is being performed, garbage collection is performed on a segment in a unit of a segment group described above. Because segments in the segment group are allocated within a same time period, data in the segments is written into the solid state disk within a same time period. Further, when writing the data, the solid state disk sequentially writes the data into one or more blocks in a time sequence of receiving the data. Therefore, after system garbage collection is performed on the segments allocated within the same time period, all valid data in a block corresponding to the segments has been copied into another block, and all data in the block corresponding to the segments is invalid data. When the solid state disk performs internal garbage collection, valid data does not need to be copied again for the block corresponding to the segments on which system garbage collection is performed. Therefore, the quantity of times of write amplification in the solid state disk is reduced.

The following describes a system garbage collection method provided in an embodiment.

Figure 4:
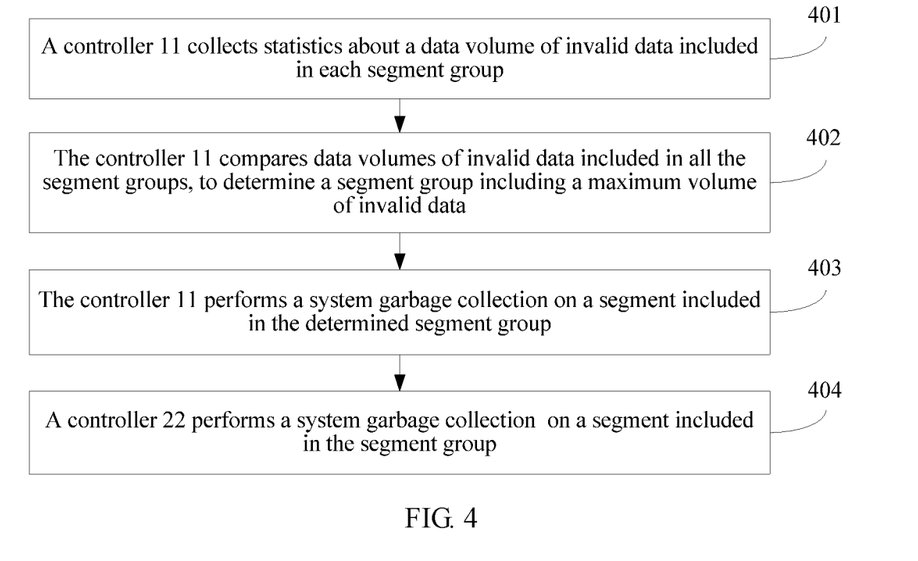
FIG. 4 is a flowchart of a system garbage collection method according to an embodiment of the present invention.

An embodiment of the present invention provides a system garbage collection method that is applied to the storage system shown in FIG. 1. The storage system includes multiple segments. Some segments belong to a controller 11, and some segments belong to a controller 22.

The multiple segments included in the storage system may be classified into several segment groups. Segments in each segment group are allocated within a same time period. Each segment group has a unique group identifier. System garbage collection provided in this embodiment is performed in a unit of a segment group. For example, the method may include the following steps.

401. The controller 11 collects statistics about a size of invalid data included in each segment group.

When a quantity of free segments is less than a preset threshold, the controller 11 may trigger a system garbage collection operation. Before performing system garbage collection, the controller 11 may collect statistics about the size of the invalid data included in each segment group. Segments included in a segment group include a segment managed by the controller 11, and also include a segment managed by the controller 22 (two controllers are used as examples herein, but another controller may be further included in this embodiment). An implementation is as follows: The controller 11 collects statistics only about a size of invalid data in segments in each group that are managed by the controller 11, and uses, as a segment group on which system garbage collection is currently to be performed, a segment group including a maximum volume of invalid data. Another implementation is as follows: The controller 11 not only needs to collect statistics about a size of invalid data in segments in each group that are managed by the controller 11, but also needs to obtain a size of invalid data in segments in each group that are managed by another controller. Specifically, the controller 11 may send a query instruction to the another controller (for example, the controller 22). The query instruction includes a group identifier. The controller 22 queries, according to the group identifier, the size of the invalid data in the segments included in the segment group, and feeds back the size to the controller 11.

In addition, it can be learned from the foregoing description that, after data is written into a segment, a bitmap may be used to record validity of the data. Therefore, statistics about a size of invalid data included in a segment may also be collected according to the bitmap.

402. The controller 11 compares sizes of invalid data included in all the segment groups, to determine a segment group including a maximum volume of invalid data.

The controller 11 may determine, according to the size about which the controller 11 collects statistics or according to the size about which the controller 11 collects statistics and the size about which the controller 22 collects statistics, the segment group including a maximum size of invalid data; and use, as a segment group which is going to be collected, the segment group including a maximum size of invalid data.

403. The controller 11 performs a system garbage collection on a segment included in the determined segment group.

Specifically, in step 403, the controller 11 instructs a solid state disk 44 to perform a system garbage collection on the segment included in the determined segment group. "Instruct" herein means that the controller 11 sends a data read request, a data write request, and an unmap command to the solid state disk 44, so that the solid state disk 44 executes the requests and the command. It may be understood that the solid state disk 44 does not proactively perform a system garbage collection operation, but passively executes the requests and the command that are sent by the controller 11. That the controller 11 instructs a solid state disk 44 to perform a system garbage collection on the segment included in the determined segment group specifically includes the following steps: (1) The controller 11 sends a data read request to the solid state disk 44. The data read request includes a source logical address. The source logical address is a logical address of valid data in a segment. After receiving the data read request, the solid state disk 44 reads the valid data from an actual address corresponding to the source logical address, and writes the valid data into a memory in a solid state disk controller. (2) The controller 11 sends a data write request to the solid state disk 44. The data write request includes a destination logical address. The destination logical address is a logical address reallocated by the controller 11 to the valid data. In addition, the destination logical address and the source logical address are corresponding to different segments. A segment corresponding to the source logical address is the segment which is going to be collected. A segment corresponding to the destination logical address is a free segment or a writing-state segment. After receiving the data write request, the solid state disk 44 reads the valid data from the memory in the solid state disk controller, and writes the valid data into an actual address corresponding to the destination logical address. (3) The controller 11 sends an unmap command to the solid state disk 44. The unmap command includes a logical address range of the segment which is going to be collected. After receiving the unmap command, the solid state disk 44 deletes a correspondence between each logical address in the logical address range and an actual address from a flash translation layer.

404. The controller 11 sends a group identifier of the segment group to the controller 22, and the controller 22 performs a system garbage collection on a segment included in the segment group.

The controller 22 determines the segment which is going to be collected according to the group identifier and a correspondence between the group identifier and an identifier of the segment, and performs a system garbage collection on the segment. A specific process is similar to 403. Details are not described herein again.

The segment on which the controller 11 performs system garbage collection in step 403 and the segment on which the controller 22 performs system garbage collection in step 404 are allocated within a same time period. The same time period ends when a quantity of segments allocated by the first controller 11 or the second controller 22 within the time period reaches a first preset threshold. When an identifier is allocated to each segment and each controller has an identifier allocation function, the same time period herein is consistent with the time period described in the example 1.

In addition, the same time period may end when a sum of quantities of segments allocated by the first controller and the second controller within the time period reaches a second preset threshold. The second preset threshold may be the same as or may be different from the first preset threshold. In this case, the first controller or the second controller needs to send a message to each other to query for a quantity of segments allocated by each other, to obtain the sum of the quantities of segments allocated within the time period. When an identifier is allocated to each segment and only one controller has an identifier allocation function, the same time period described herein may also end when a quantity of identifiers allocated by the controller that has the identifier allocation function reaches the second preset threshold.

In addition to the implementation in which the controller 11 collects statistics about the size of the invalid data included in each segment group, this embodiment still has an implementation: A controller is specified in a storage system, and is specially configured to collect statistics about a size of invalid data included in each segment group. For example, the specified controller separately sends a query instruction to the controller 11 and the controller 22 to obtain a size of invalid data included in segments in each segment group that are managed by the controller 11 and a size of invalid data included in segments in each segment group that are managed by the controller 22; determines, according to a query result, a segment group including a maximum volume of invalid data; and separately sends a group identifier of the segment group to the controller 11 and the controller 22. The controller 11 and the controller 22 separately determine a segment which is going to be collected according to a correspondence between the group identifier and an identifier of a segment, and perform a system garbage collection on the to-be-collected segment.

In addition, in this embodiment, the sizes of the invalid data included in all the segment groups may not be compared, but the size of the invalid data included in each segment group may be monitored. When a size of invalid data included in a segment group reaches a preset threshold, a garbage collection operation is performed on the segment group in which the size of the invalid data reaches the preset threshold.

Alternatively, the controller may successively perform a system garbage collection on all the segment groups with no consideration of sizes of the invalid data in the segment groups.

Alternatively, according to a time at which a system garbage collection is performed on each segment group last time, the controller may select, as an object on which a system garbage collection is currently to be performed, a segment group on which system garbage collection has not been performed for a longest time.

In step 404, when the controller 11 performs system garbage collection, the controller 22 performs a system garbage collection on the segment, which is allocated by the controller 22, in the determined segment group. However, the controller 11 and the controller 22 do not perform a system garbage collection absolutely at the same time, provided that both the controller 11 and the controller 22 complete system garbage collection on the determined segment group before system garbage collection is enabled for a next segment group. In practical application, the controller 11 and the controller 22 perform a system garbage collection in a unit of a segment group. After a system garbage collection on all segments included in a segment group is completed, a system garbage collection is enabled for a next segment group. Herein, that a system garbage collection on all segments included in a segment group is completed means that the controller 11 completes a system garbage collection on a segment that is in the segment group and that is managed by the controller 11, and the controller 22 also completes a system garbage collection on a segment that is in the segment group and that is managed by the controller 22. For example, when completing system garbage collection on the segment group including a maximum volume of invalid data, the controller 11 and the controller 22 searches for a next segment group including a maximum volume of invalid data and enables system garbage collection.

Persons of ordinary skill in the art may understand that, each aspect of the present invention or a possible implementation of each aspect may be specifically implemented as a system, a method, or a computer program product. Therefore, each aspect of the present invention or a possible implementation of each aspect may use forms of hardware only embodiments, software only embodiments (including firmware, resident software, and the like), or embodiments with a combination of software and hardware, which are uniformly referred to as "circuit", "module", or "system" herein. In addition, each aspect of the present invention or the possible implementation of each aspect may take a form of a computer program product, and the computer program product is computer-readable program code stored in a computer-readable medium.

The computer-readable medium includes but is not limited to an electronic, magnetic, optical, electromagnetic, infrared, or semi-conductive system, device, or apparatus, or any appropriate combination thereof, such as a random access memory (RAM), a read-only memory (ROM), an erasable programmable read only memory (EPROM), or an optical disc.

A processor in a computer reads the computer-readable program code stored in the computer-readable medium, so that the processor can perform a function and an action specified in each step or a combination of steps in a flowchart.

All computer-readable program code may be performed on a user's computer, or some may be performed on a user's computer as a standalone software package, or some may be performed on a user's computer while some is performed on a remote computer, or all code may be performed on a remote computer or a server. It should also be noted that, in some alternative implementation solutions, each step in the flowcharts or functions specified in each block in the block diagrams may not occur in the illustrated order. For example, two consecutive steps or blocks in the illustration, which are dependent on an involved function, may actually be performed substantially at the same time, or these blocks may sometimes be performed in reverse order.

Persons of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. Persons of ordinary skill in the art may use different methods to implement the described functions for each particular application, but it should not be considered that the implementation goes beyond the scope of the present invention.

The foregoing descriptions are merely specific implementations of the present invention, but are not intended to limit the protection scope of the present invention. Any variation or replacement readily figured out by persons skilled in the art within the technical scope disclosed in the present invention shall fall within the protection scope of the present invention. Therefore, the protection scope of the present invention shall be subject to the protection scope of the claims.

What is claimed is:

1. A storage system, comprising:
   a first controller;
   a second controller different from the first controller; and
   a plurality of solid state disks coupled to the first controller and the second controller, each of the plurality of solid state disks including multiple blocks, the multiple blocks comprising a target block,
   wherein the first controller is configured to:
   allocate a first set of segments from multiple logical addresses provided by the plurality of the solid state disks during a first time period, wherein a target block includes a first portion and a second portion, the first portion belonging to the first set of segments; and
   perform system garbage collection on the first set of segments including the first portion of the target block, and
   wherein the second controller is configured to:
   allocate a second set of segments from the multiple logical addresses during the first time period, wherein the second portion belongs to the second set of segments; and
   perform system garbage collection on the second set of segments including the second portion of the target block, in response to the first controller performing the system garbage collection on the first set of segments including the first portion of the target block;
   wherein the first time period ends when a quantity of segments allocated by the first controller or the second controller during the first time period reaches a first preset threshold.

2. The storage system according to claim 1, wherein the first set of segments and the second set of segments belong to a same segment group, and a size of invalid data comprised in the segment group is larger than a size of invalid data comprised in any other segment group.

3. The storage system according to claim 2, wherein
   the first controller is further configured to send a group identifier of the segment group to the second controller, and
   the second controller is further configured to determine the second set of segments, according to a pre-stored correspondence between the group identifier and an identifier of the second set of segments.

4. The storage system according to claim 1, wherein
   the first controller is configured to send, to the plurality of solid state disks, a source logical address of valid data comprised in each of the first set of segments;
   allocate a destination logical address to the valid data;
   send the destination logical address to the plurality of solid state disks to instruct the plurality of solid state disks to copy the valid data from the source logical address into the destination logical address; and
   send an unmap command to the plurality of solid state disks to instruct the plurality of solid state disks to delete a correspondence between a logical address and an actual address of each segment, wherein the unmap command comprises a logical address range of each of the first set of segments.

5. A method for collecting system garbage for a storage system, comprising:
   allocating, by a first controller of the storage system, a first set of segments from multiple logical addresses provided by a plurality of solid state disks coupled to the first controller during a first time period, each of the plurality of solid state disks including multiple blocks, the multiple blocks comprising a target block, wherein a target block includes a first portion and a second portion, and wherein the first portion belongs to the first set of segments:
   allocating, by a second controller of the storage system different from the first controller, a second set segments from the multiple logical address provided by the plurality of solid state disks coupled to the second controller during the first time period, wherein the second portion belongs to the second set of segments;
   performing, by the first controller, system garbage collection on the first set of segments including the first portion of the target block; and
   performing, by a second controller, system garbage collection on the second set of segments including the second portion of the target block, in response to the first controller performing the system garbage collection on the first set of segments including the first portion of the target block;

wherein the first time period ends when a quantity of segments allocated by the first controller or the second controller during the first time period reaches a first preset threshold.

6. The method according to claim 5, wherein the first set of segments and the second set of segments belong to a same segment group, and a size of invalid data comprised in the segment group is larger than a size of invalid data comprised in any other segment group.

7. The method according to claim 6, further comprising:
sending, by the first controller, a group identifier of the segment group to the second controller; and
determining, by the second controller, the second set of segments according to a pre-stored correspondence between the group identifier and an identifier of the second set of segments.

8. The method according to claim 5, wherein
the performing, by the first controller, the system garbage collection on the first set of segments comprises:
sending, by the first controller to the plurality of solid state disks, a source logical address of valid data comprised in each of the first set of segments;
allocating, by the first controller, a destination logical address to the valid data;
sending the destination logical address to the plurality of solid state disks, to instruct the plurality of solid state disks to copy the valid data from the source logical address into the destination logical address; and
sending, by the first controller, an unmap command to the plurality of solid state disks to instruct the plurality of solid state disks to delete a correspondence between a logical address and an actual address of each segment, wherein the unmap command comprises a logical address range of each of the first set of segments.

* * * * *